(12) United States Patent
Liu

(10) Patent No.: US 10,811,385 B2
(45) Date of Patent: Oct. 20, 2020

(54) WAFER-LEVEL SYSTEM-IN-PACKAGE STRUCTURE AND ELECTRONIC APPARATUS THEREOF

(71) Applicant: Ningbo Semiconductor International Corporation, Ningbo (CN)

(72) Inventor: Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 29 days.

(21) Appl. No.: 16/158,789

(22) Filed: Oct. 12, 2018

(65) Prior Publication Data
US 2019/0103332 A1 Apr. 4, 2019

Related U.S. Application Data

(63) Continuation of application No. PCT/CN2018/093769, filed on Jun. 29, 2018.

(30) Foreign Application Priority Data

Sep. 30, 2017 (CN) .......................... 2017 1 0917071
Sep. 30, 2017 (CN) .......................... 2017 1 0919199
Jan. 24, 2018 (CN) .......................... 2018 1 0070260

(51) Int. Cl.
*H01L 23/02* (2006.01)
*H01L 25/065* (2006.01)
(Continued)

(52) U.S. Cl.
CPC ........ *H01L 25/0652* (2013.01); *H01L 21/486* (2013.01); *H01L 21/56* (2013.01);
(Continued)

(58) Field of Classification Search
CPC ..... H01L 21/56; H01L 21/486; H01L 23/481; H01L 25/0652; H01L 21/76898; H01L 21/563; H01L 24/14
(Continued)

(56) References Cited

U.S. PATENT DOCUMENTS 8,455,301 B2 * 6/2013 Lee ..................... H01L 21/561
257/622
8,575,758 B2 * 11/2013 West ..................... H01L 21/78
257/774
(Continued)

FOREIGN PATENT DOCUMENTS

CN 104392958 A 3/2015
CN 105621345 A 6/2016
(Continued)

*Primary Examiner* — S. V. Clark
(74) *Attorney, Agent, or Firm* — Anova Law Group, PLLC

(57) ABSTRACT

A wafer-level system-in-package structure and an electronic apparatus are provided. The wafer-level system-in-package structure includes a substrate having a plurality of first chips formed therein. A first chip is formed by being grown on the substrate through a semiconductor process. The wafer-level system-in-package structure also includes an encapsulation layer having a plurality of second chips embedded therein. The encapsulation layer covers the substrate and the first chips. At least one of the plurality of second chips is electrically connected to at least one of the plurality of first chips through a conductive bump, and electrically-connected first and second chips have an overlapping portion.

20 Claims, 8 Drawing Sheets

(51) Int. Cl.
*H01L 23/538* (2006.01)
*H01L 23/00* (2006.01)
*H01L 21/48* (2006.01)
*H01L 21/56* (2006.01)
*H01L 25/00* (2006.01)
*H01L 21/683* (2006.01)
*H01L 23/31* (2006.01)
*H01L 21/768* (2006.01)
*H01L 23/48* (2006.01)

(52) U.S. Cl.
CPC ........ *H01L 21/565* (2013.01); *H01L 21/6835* (2013.01); *H01L 21/76898* (2013.01); *H01L 23/3107* (2013.01); *H01L 23/3121* (2013.01); *H01L 23/481* (2013.01); *H01L 23/5384* (2013.01); *H01L 23/5386* (2013.01); *H01L 23/5389* (2013.01); *H01L 24/02* (2013.01); *H01L 24/09* (2013.01); *H01L 24/11* (2013.01); *H01L 24/16* (2013.01); *H01L 24/17* (2013.01); *H01L 24/19* (2013.01); *H01L 24/32* (2013.01); *H01L 24/80* (2013.01); *H01L 24/81* (2013.01); *H01L 24/83* (2013.01); *H01L 24/94* (2013.01); *H01L 24/96* (2013.01); *H01L 25/00* (2013.01); *H01L 25/50* (2013.01); *H01L 24/13* (2013.01); *H01L 24/20* (2013.01); *H01L 24/97* (2013.01); *H01L 2221/68381* (2013.01); *H01L 2224/02372* (2013.01); *H01L 2224/0345* (2013.01); *H01L 2224/1132* (2013.01); *H01L 2224/11334* (2013.01); *H01L 2224/11849* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16225* (2013.01); *H01L 2224/32145* (2013.01); *H01L 2224/80894* (2013.01); *H01L 2224/81005* (2013.01); *H01L 2224/81191* (2013.01); *H01L 2224/81815* (2013.01); *H01L 2224/81986* (2013.01); *H01L 2224/83005* (2013.01); *H01L 2224/8385* (2013.01); *H01L 2224/83896* (2013.01); *H01L 2224/92224* (2013.01); *H01L 2224/94* (2013.01); *H01L 2224/96* (2013.01); *H01L 2224/97* (2013.01); *H01L 2924/0105* (2013.01); *H01L 2924/01029* (2013.01); *H01L 2924/13091* (2013.01); *H01L 2924/1431* (2013.01); *H01L 2924/1461* (2013.01); *H01L 2924/181* (2013.01); *H01L 2924/3511* (2013.01)

(58) Field of Classification Search
USPC ........................................ 257/686, 777, 778
See application file for complete search history.

(56) References Cited

U.S. PATENT DOCUMENTS

| | | | | |
|---|---|---|---|---|
| 2010/0078789 | A1* | 4/2010 | Choi | H01L 21/6835 |
| | | | | 257/686 |
| 2010/0258932 | A1* | 10/2010 | Yoshida | H01L 21/561 |
| | | | | 257/686 |
| 2011/0024888 | A1* | 2/2011 | Pagaila | H01L 23/13 |
| | | | | 257/686 |
| 2011/0175215 | A1* | 7/2011 | Farooq | H01L 23/481 |
| | | | | 257/686 |
| 2014/0322866 | A1 | 10/2014 | Chen et al. | |
| 2015/0130072 | A1* | 5/2015 | Wu | H01L 23/562 |
| | | | | 257/774 |
| 2015/0255427 | A1* | 9/2015 | Sung | H01L 23/5384 |
| | | | | 257/737 |

FOREIGN PATENT DOCUMENTS

| | | |
|---|---|---|
| CN | 105870024 A | 8/2016 |
| CN | 107176586 A | 9/2017 |

* cited by examiner

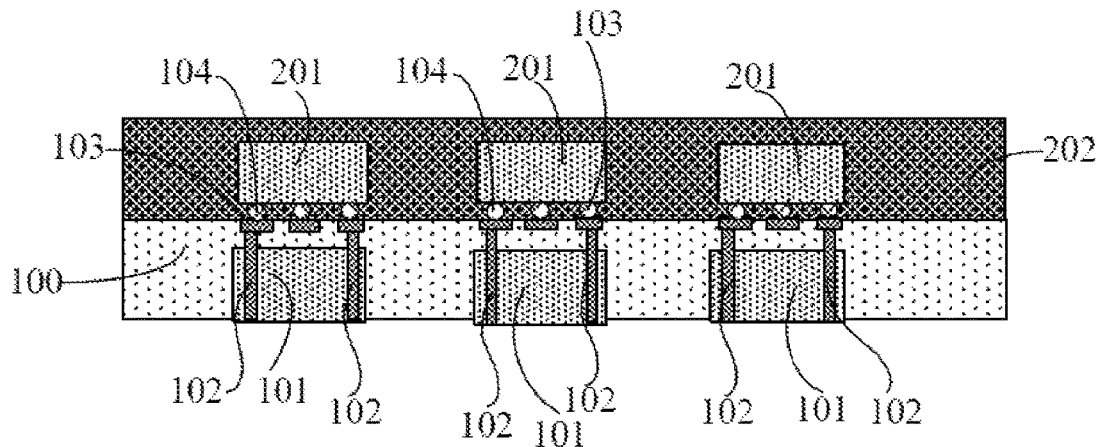

Figure 4D

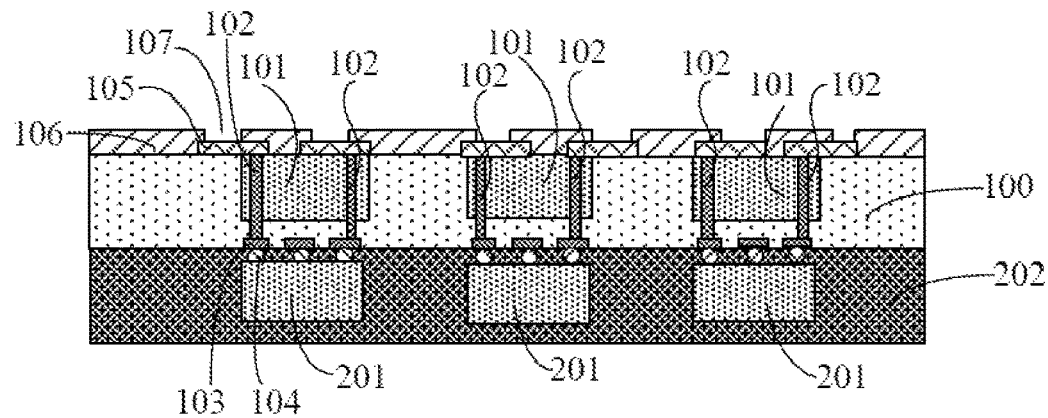

Figure 4E

| Providing a substrate having a plurality of first chips, where the first chip is formed by being grown on the substrate through a semiconductor process | S1 |
| --- | --- |
| Providing a plurality of second chips, where the second chip is disposed on the substrate, at least one of the second chips is electrically connected to at least one of the first chips through a conductive bump, and the first chip and the second chip that are electrically connected to each other have an overlapping portion | S2 |
| Providing an encapsulation material to cover the second chip and the substrate and to fix the second chip | S3 |

Figure 5

WAFER-LEVEL SYSTEM-IN-PACKAGE STRUCTURE AND ELECTRONIC APPARATUS THEREOF

CROSS-REFERENCES TO RELATED APPLICATIONS

This application is a continuation application of PCT Patent Application No. PCT/CN2018/093769, filed on Jun. 29, 2018, which claims priority to Chinese patent applications No. 201810070260.4, filed on Jan. 24, 2018, No. 201710919199.1, filed on Sep. 30, 2017, No. 201710917071.1, filed on Sep. 30, 2017, the entirety of which is incorporated herein by reference.

FIELD OF THE DISCLOSURE

The present disclosure generally relates to the field of semiconductor technology and, more particularly, relates to a wafer-level system-in-package structure and electronic apparatus thereof.

BACKGROUND

The system-in-package (SiP), which integrates multiple components with different functions, e.g., active components, passive components, micro-electromechanical systems (MEMS), and optical components, etc., into a single unit to form a system or subsystem that provides multiple functions and allows heterogeneous IC integration, is a desired package integration technology. Compared to system on chip (SoC) package, the system-in-package integration is featured with advantages such as substantially simple, substantially short design cycle and time-to-market cycle, and substantially low cost, enabling to implement substantially complex systems.

Compared to an existing system-in-package, a wafer-level system-in-package completes the package integration process on the device wafer, is featured with advantages such as greatly reduced area of the packaging structure, reduced manufacturing cost, optimized electrical performance, and batch manufacturing, and can significantly reduce the workload and equipment demands.

An existing wafer-level packaging method often includes: providing a substrate; forming a dielectric layer on the substrate; attaching a plurality of first chips to the dielectric layer on the substrate through an adhesive layer; forming another dielectric layer on the substrate; forming a conductive layer in the dielectric layer; stacking a second chip on the first chip, and forming a molding material on the dielectric layer to surround the second chip. However, such wafer-level packaging method has many issues, e.g., complex processes, and poor stability of the chip adhered by the adhesive layer, etc.

In view of the significant advantages of the wafer-level system-in-package, how to better implement wafer-level system-in-package has been a hot topic in the industry. The disclosed structure and device are directed to solve one or more problems set forth above and other problems in the art.

BRIEF SUMMARY OF THE DISCLOSURE

One aspect of the present disclosure includes a wafer-level system-in-package structure. The wafer-level system-in-package structure includes a substrate having a plurality of first chips formed therein. A first chip is formed by being grown on the substrate through a semiconductor process. The wafer-level system-in-package structure also includes an encapsulation layer having a plurality of second chips embedded therein. The encapsulation layer covers the substrate and the first chips. At least one of the plurality of second chips is electrically connected to at least one of the plurality of first chips through a conductive bump, and electrically-connected first and second chips have an overlapping portion.

In one embodiment, the substrate has a front surface and a back surface, and the encapsulation layer covers one of the front and back surfaces.

In one embodiment, the wafer-level system-in-package structure further includes a first bonding pad located on the other surface of the substrate with respect to the encapsulation layer; and a plug, electrically connecting the first bonding pad to the first chip.

In one embodiment, the conductive bump is made of one of tin and copper.

In one embodiment, the encapsulation layer is a mold layer.

In one embodiment, the mold layer is made of epoxy resin.

In one embodiment, the wafer-level system-in-package structure further includes a passivation layer having an opening. The passivation layer covers the first bonding pad and the substrate, and the opening exposes the first bonding pad.

In one embodiment, the wafer-level system-in-package structure further includes a second bonding pad, located on a front surface of the substrate and electrically connected to the first chip.

In one embodiment, the plug is one of a metal plug and a silicon plug.

In one embodiment, the first bonding pad is made of one of Ag, Au, Cu, Pd, Cr, Mo, Ti, Ta, Sn, W, and Al.

Another aspect of the present disclosure includes an electronic apparatus. The electronic apparatus includes a wafer-level system-in-package structure. The wafer-level system-in-package structure includes a substrate having a plurality of first chips formed therein. A first chip is formed by being grown on the substrate through a semiconductor process. The wafer-level system-in-package structure also includes an encapsulation layer having a plurality of second chips embedded therein. The encapsulation layer covers the substrate and the first chips. At least one of the plurality of second chips is electrically connected to at least one of the plurality of first chips through a conductive bump, and electrically-connected first and second chips have an overlapping portion.

In one embodiment, the substrate has a front surface and a back surface, and the encapsulation layer covers one of the front and back surfaces.

In one embodiment, the wafer-level system-in-package structure further includes a first bonding pad located on the other surface of the substrate with respect to the encapsulation layer; and a plug, electrically connecting the first bonding pad to the first chip.

In one embodiment, the conductive bump is made of one of tin and copper.

In one embodiment, the encapsulation layer is a mold layer.

In one embodiment, the mold layer is made of epoxy resin.

In one embodiment, the wafer-level system-in-package structure further includes a passivation layer having an opening. The passivation layer covers the first bonding pad and the substrate, and the opening exposes the first bonding pad.

In one embodiment, the wafer-level system-in-package structure further includes a second bonding pad, located on a front surface of the substrate and electrically connected to the first chip.

In one embodiment, the plug is one of a metal plug and a silicon plug.

In one embodiment, the first bonding pad is made of one of Ag, Au, Cu, Pd, Cr, Mo, Ti, Ta, Sn, W, and Al.

Other aspects of the present disclosure can be understood by those skilled in the art in light of the description, the claims, and the drawings of the present disclosure.

BRIEF DESCRIPTION OF THE DRAWINGS

FIGS. 4A-4E illustrate schematic cross-sectional views of semiconductor structures corresponding to certain stages of an exemplary wafer-level system-in-package method consistent with various disclosed embodiments of the present disclosure;

FIG. 5 illustrates a flow chart of an exemplary wafer-level system-in-package method consistent with various disclosed embodiments of the present disclosure;

DETAILED DESCRIPTION

Figure 1A:
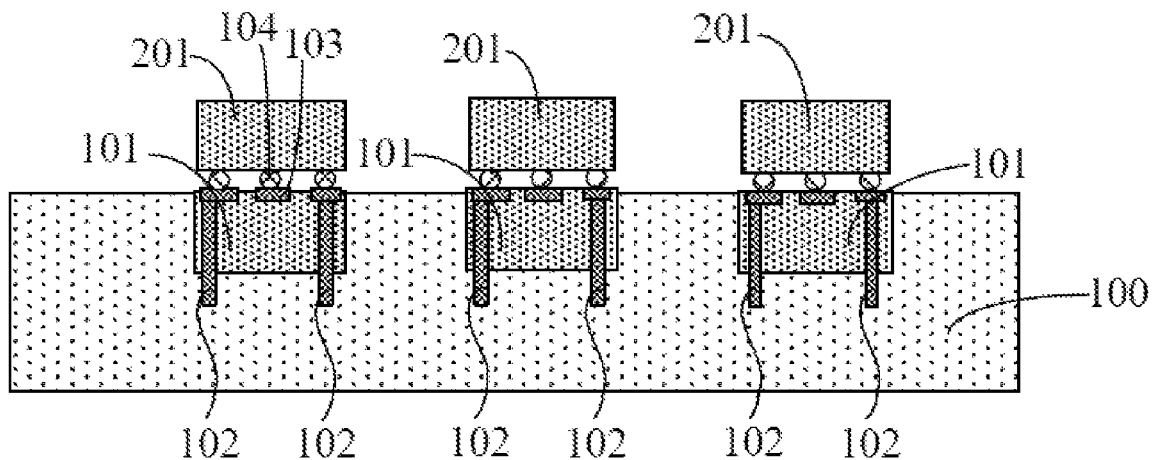
FIGS. 1A-1E illustrate schematic cross-sectional views of semiconductor structures corresponding to certain stages of an exemplary wafer-level system-in-package method consistent with various disclosed embodiments of the present disclosure.

Reference will now be made in detail to exemplary embodiments of the disclosure, which are illustrated in the accompanying drawings. However, those skilled in the art may easily understand that the present disclosure may be implemented without one or more of these details. In certain examples, some well-known technical features in the art are not described herein to avoid confusion with the present disclosure.

The present disclosure may be implemented in various forms and is limited to the embodiments set forth herein. The disclosed embodiments may enable the present disclosure to be thorough and complete, and may fully convey the scope of the present disclosure to those skilled in the art. In the drawings, the size and relative dimensions of the layers and regions may be exaggerated for clarity. Wherever possible, the same reference numbers will be used throughout the drawings to refer to the same or the alike parts.

When a component or layer is referred to as "on", "adjacent to", "connected to", or "coupled to" another component or layer, the component or layer may be directly on, adjacent to, connected to, or coupled to the another component or layer, or additional component(s) or layer(s) may be disposed between thereof. In contrast, when a component or layer is referred to as "directly on", "directly adjacent to", "directly connected to", or "directly coupled to" another component or layer, the additional component(s) or layer(s) may not be disposed between thereof. Although terms of first, second, third, etc., may be used to describe various components, units, regions, layers, and/or portions, the components, regions, layers, and/or portions may not be limited to such terms. Such terms are used to distinguish a component, unit, region, layer, or portion from another component, unit, region, layer, or portion. Thus, without departing from the scope of the present disclosure, a first component, unit, region, layer, or portion may be referred to as a second component, unit, region, layer or portion.

Spatial relationship terms such as "under", "underneath", "below", "beneath", "over", "above", etc., may be used for illustrative purposes to describe the relationship between one component or feature and another component or feature illustrated in the Figures. In addition to the orientations illustrated in the Figures, the spatially relative terms are intended to include different orientations of the device in use and operation. For example, if the device in the Figures is flipped, the component or feature described as "below", "underneath" or "under" another component or feature may be oriented as "on" another component or feature. Thus, the exemplary terms "below" and "under" may include "above" and "under" two orientations. The device may have additional orientations (90 degrees rotation or other orientations), and, thus, the spatial descriptors used herein may be interpreted accordingly.

The terms used herein are for the purpose of describing the detailed embodiments and are not intended to limit the scope of the present disclosure. The singular forms of "a", "one", and "the" may be intended to include plural forms unless otherwise clearly specified by the context. The terms of "composition" and/or "comprising" may be used to determine the presence of the features, integers, steps, operations, components and/or units, but may not exclude the presence or addition of one or more of other features, integers, steps, operations, components, units, and groups. The term "and/or" may include any and all combinations of the related items.

Various embodiments of the present disclosure are described herein with reference to cross-sectional views of schematics of the optional embodiments (and intermediate structures) of the present disclosure. Correspondingly, illustrated shape variations caused by for example, manufacturing techniques and/or tolerances, may be expected. Thus, embodiments of the present disclosure may not be limited to the specific shapes of the regions illustrated herein, but may include variations in the shape caused by for example, manufacturing. The region shown in the Figure is generally schematic, and the illustrated shape is not intended to show the actual shape of the region of the device, and is not intended to limit the scope of the present disclosure.

To fully understand the present disclosure, detailed structures and steps are set forth in the following descriptions to explain the technical solutions of the present disclosure. The optional embodiments of the present disclosure are described in detail below, but the present disclosure may have other embodiments in addition to the detailed description.

Exemplary Embodiment 1

In view of the advantages of wafer-level packaging, the present disclosure provides a wafer-level system-in-package structure. The wafer-level system-in-package structure may include a substrate having a plurality of first chips formed therein. The first chip may be formed by being grown on the substrate through a semiconductor process. The wafer-level system-in-package structure may also include an encapsulation layer having a plurality of second chips embedded therein. The encapsulation layer may cover the substrate and the first chip. At least one of the second chips may be electrically connected to at least one of the first chips through a conductive bump. The first chip and the second chip that are electrically connected to each other may have an overlapping portion.

Figure 1B:
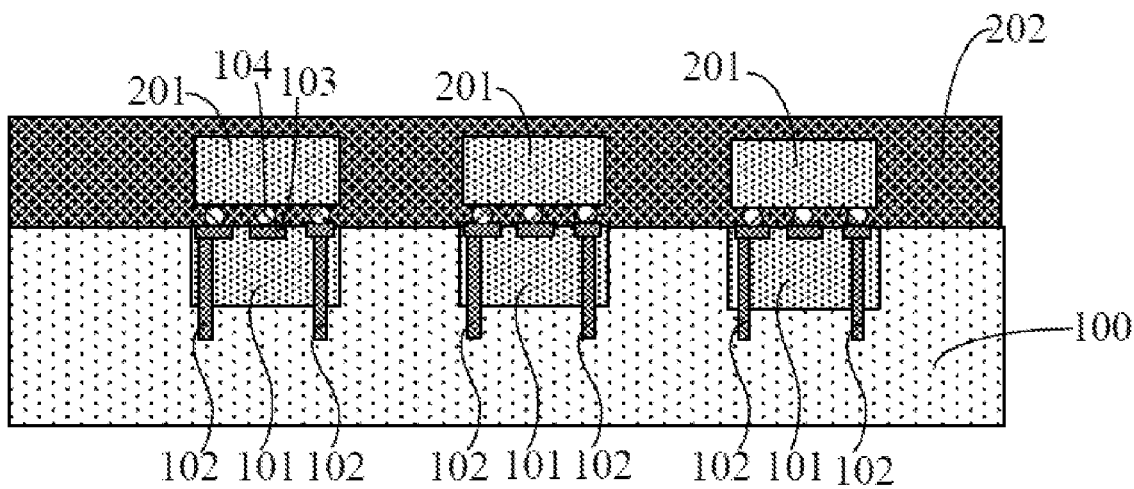
Figure 1C:
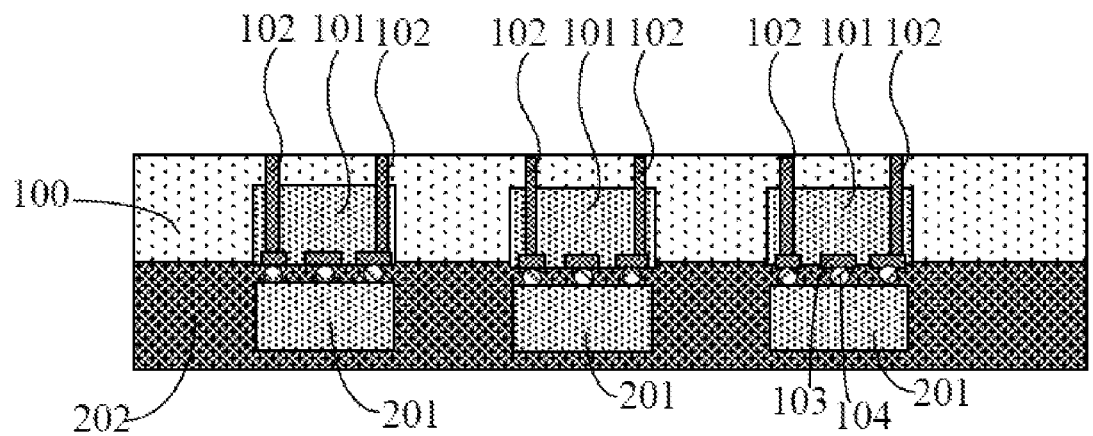
Figure 1D:
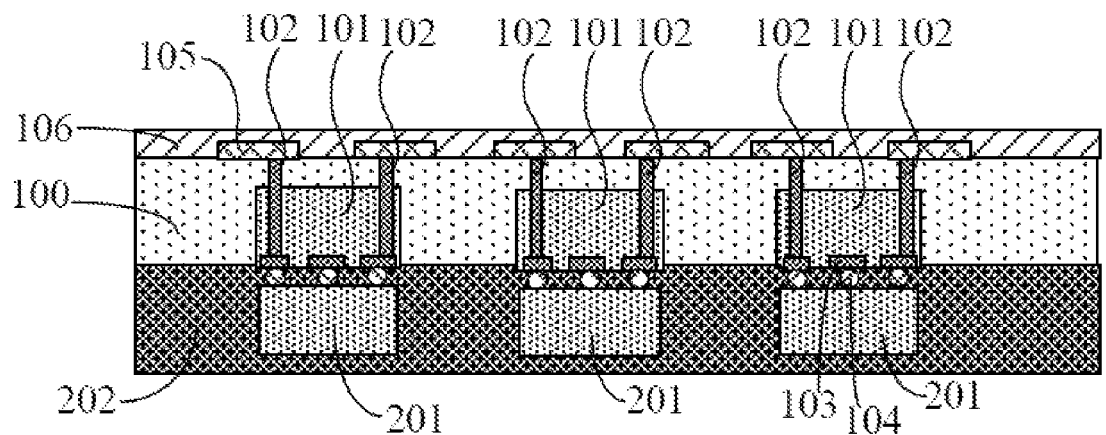
Figure 1E:
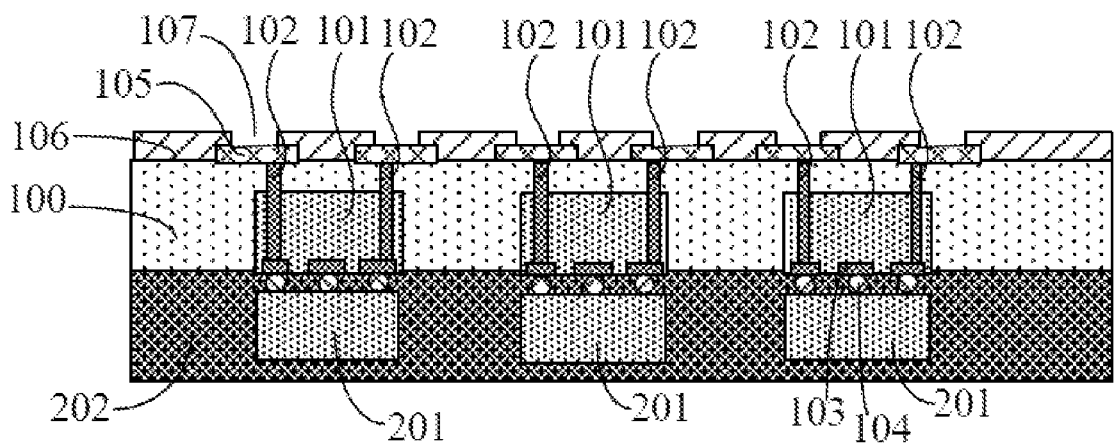
Figure 2A:
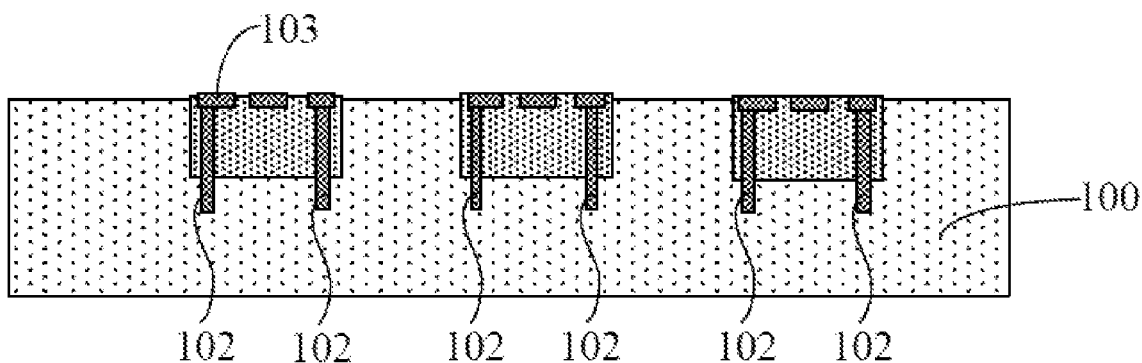
FIGS. 2A-2E illustrate schematic cross-sectional views of semiconductor structures corresponding to certain stages for obtaining a structure illustrated in FIG. 1A in an exemplary wafer-level system-in-package method consistent with various disclosed embodiments of the present disclosure.
Figure 2B:
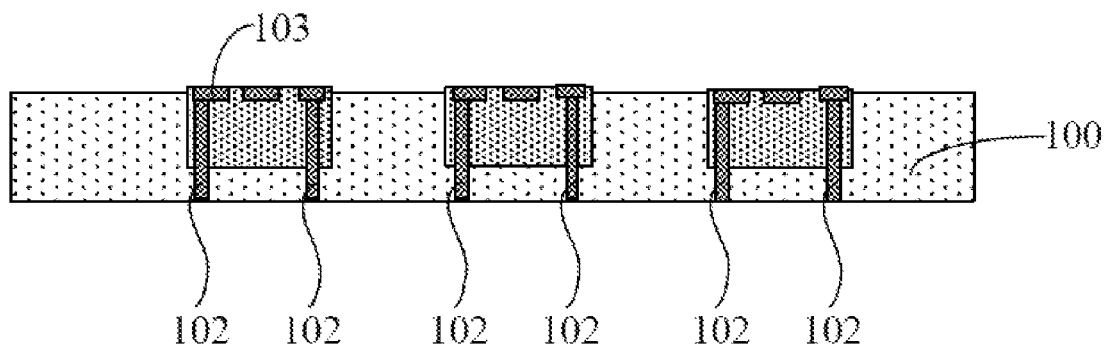
Figure 2C:
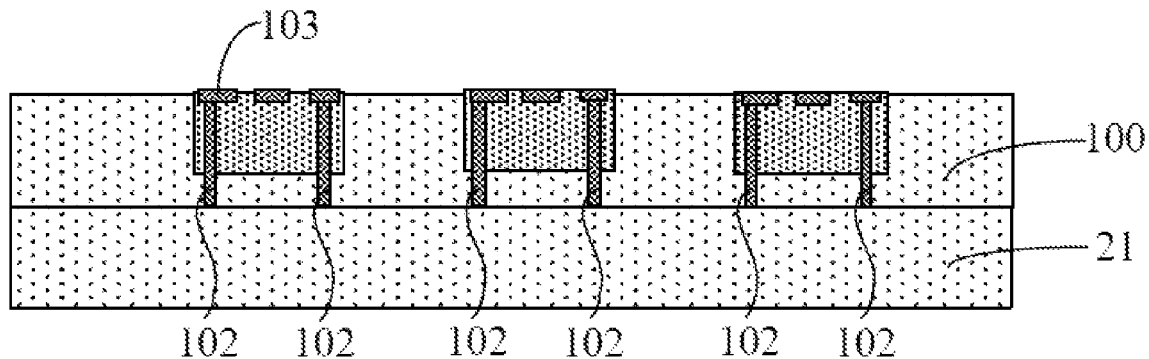
Figure 2D:
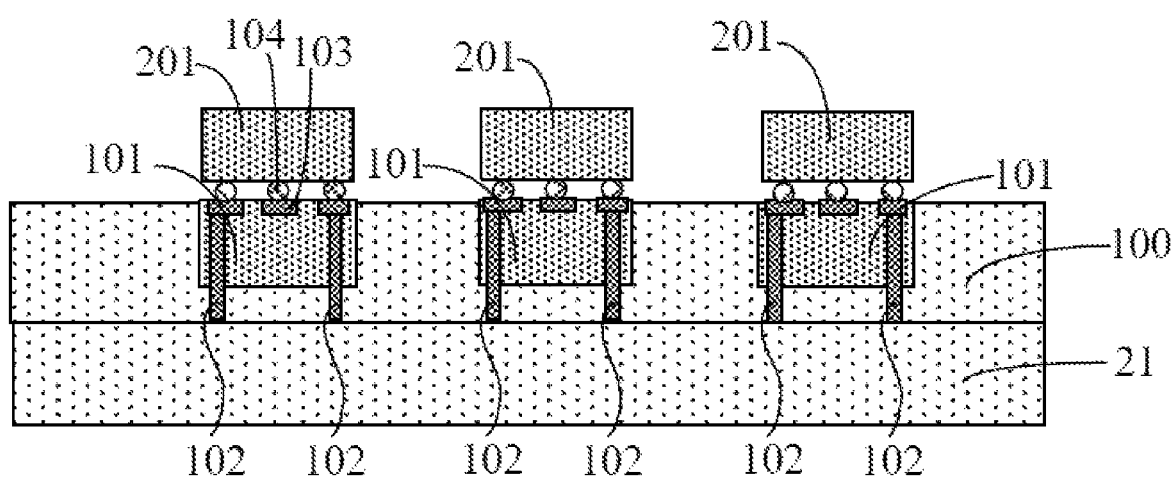
Figure 2E:
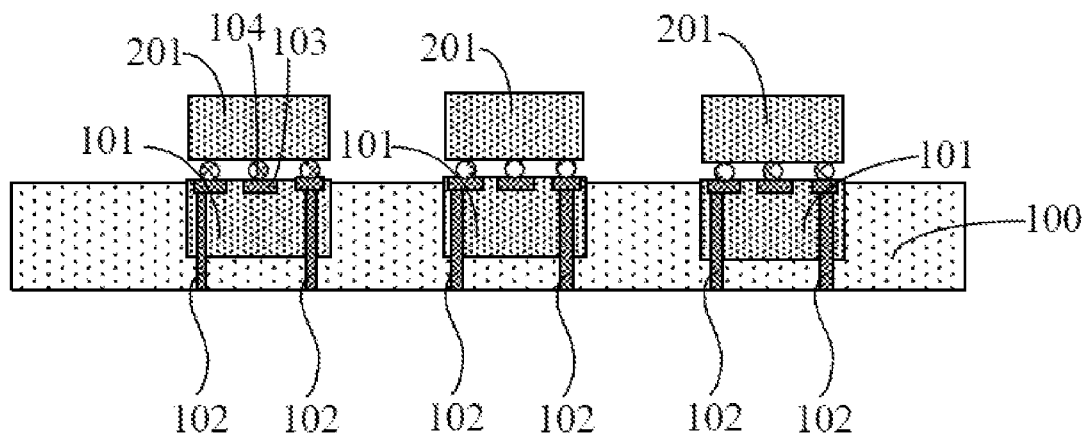

The wafer-level system-in-package structure of the present disclosure may be described in detail with reference to FIG. 1E. FIG. 1E illustrates a cross-sectional view of an exemplary wafer-level system-in-package structure consistent with various disclosed embodiments of the present disclosure.

In one embodiment, referring to FIG. 1E, the wafer-level system-in-package structure may include a substrate 100 having a plurality of first chips 101 formed therein. The wafer-level system-in-package structure may also include an encapsulation layer 202 having a plurality of second chips 201 embedded therein. The encapsulation layer 202 may cover the substrate 100 and the first chip 101.

In one embodiment, at least one of the second chips 201 may be electrically connected to at least one of the first chips 101. For example, at least one of the second chips 201 may be electrically connected to at least one of the first chips 101 through a conductive bump.

In one embodiment, referring to FIG. 1E, the electrically-connected first chip 101 and second chip 201 may have an overlapping portion. In other words, the projections of the electrically-connected first chip 101 and second chip 201 onto the substrate may have an overlapping portion. In one embodiment, the first chip 101 and the second chip 201 may be partially overlapped. In another embodiment, when the first chip 101 and the second chip 201 are identical in size, the first chip 101 and the second chip 201 may be fully overlapped. The overlap herein may refer to that the first chip 101 and the second chip 201 are overlapped in a top view.

In one embodiment, the first chip 101 may be electrically connected to the second chip 201 through a conductive bump 104. For example, a plurality of conductive bumps 104 may be disposed on a surface of at least one of the plurality of first chips 101. The plurality of conductive bumps 104 may be arranged in an array on the surface of the first chip.

In one embodiment, referring to FIG. 1E, the packaging structure may further include a first bonding pad 105 located on the other surface of the substrate 100 with respect to the encapsulation layer 202 (or with respect to the second chip 201). For example, referring to FIG. 1E, the encapsulation layer 202 may cover a front surface of the substrate 100, and then the first bonding pad 105 may be disposed on a back surface of the substrate 100.

In one embodiment, at least one plug 102 may be disposed in at least one of the plurality of first chips 101. The plug 102 may penetrate the first chip 101. For example, the plug 102 may penetrate the first chip 101 as well as the front and back surfaces of the substrate, and may be electrically connected to the first bonding pad 105 formed on the back surface of the substrate.

In one embodiment, the plug 102 may be disposed in an edge region of the first chip 101. In another embodiment, the plug 102 may be disposed in any other suitable region capable of being electrically connected to the first chip 101 without affecting the functional realization of the first chip 101.

In one embodiment, each first bonding pad 105 may be electrically connected to one plug 102, respectively. The first bonding pad 105 may be used to lead the device structure composed of the first chip 101 and/or the second chip 201 to be connected to an external circuit.

In one embodiment, referring to FIG. 1E, the packaging structure may further include a second bonding pad 103. The second bonding pad 103 may be disposed on a surface of the substrate 100 on which the second chip 201 is disposed. For example, referring to FIG. 1E, the second bonding pad 103 may be disposed on the front surface of the substrate 100, and may be electrically connected to the first chip 101.

In one embodiment, a plurality of spaced second bonding pads 103 may be formed on a surface of the first chip 101. At least one of the plurality of second bonding pads 103 may be disposed on a surface of the plug 102, and may be electrically connected to the plug 102. In other words, the second bonding pad 103 may be disposed between the conductive bump 104 and the first chip 101. A gap may be formed between adjacent second bonding pads 103.

In one embodiment, the conductive bump 104 may be disposed on the second bonding pad 103, and may be electrically connected to the second bonding pad. In another embodiment, an under-bump metallization (UBM) structure (not illustrated) may be disposed between the second bonding pad and the conductive bump 104. The under-bump metallization (UBM) structure may be formed by stacking multiple metal layers including an adhesive layer, a barrier layer, and a seed or wetting layer. The UBM structure may facilitate to prevent diffusion between the conductive bump and the integrated circuit of the multi-chip semiconductor device, and may provide a low resistance electrical connection.

In one embodiment, referring to FIG. 1E, the encapsulation layer 202 may cover the substrate 100 and the first chip 101. The second chip 201 may be enclosed within the encapsulation layer 202. For example, referring to FIG. 1E, the substrate 100 may have the front surface and the back surface. The encapsulation layer 202 may cover the front surface. A top surface of the encapsulation layer 202 may be above a top surface of the second chip 201. The encapsulation layer 202 may fix the second chip, and may provide physical and electrical protection against external interference.

In one embodiment, referring to FIG. 1E, the packaging structure may include a passivation layer 106 having an opening 107 formed therein. The passivation layer 106 may cover the first bonding pad 105 and the substrate 100. The opening 107 may expose the first bonding pad 105. In one embodiment, the opening 107 may expose at least a portion of the surface of the first bonding pad 105. In one embodiment, a top surface of the passivation layer 106 may be above a top surface of the first bonding pad 105. The passivation layer may have an any suitable thickness, which is not limited by the present disclosure and may be determined according to various applications.

In one embodiment, the substrate 100 may be at least one of Si, Ge, SiGe, SiC, SiGeC, InAs, GaAs, InP, InGaAs, group III-V compounds semiconductors, and a multilayer structure of the semiconductors thereof. In another embodiment, the substrate 100 may be silicon-on-insulator (SOI), stacked silicon-on-insulator (SSOI), stacked silicon germanium-on-insulator (S—SiGeOI), silicon germanium-on-insulator (SiGeOI), or germanium-on-insulator (GeOI), etc. In certain embodiments, the substrate 100 may be any other suitable substrate structure, and the substrate 100 may be a single-layer structure or a multi-layer (i.e., two or more layers) structure.

The chip in the present disclosure (e.g., the first chip 101 and the second chip 201) may be any type of semiconductor chip. In one embodiment, the chip may be a memory, a logic circuit, a power device, a bipolar device, a separate MOS transistor, a micro-electromechanical system (MEMS), or any other suitable active device. In another embodiment, the chip may be a light-emitting diode, or any other suitable optoelectronic device. In certain embodiments, the chip may be a passive device, e.g., a resistor, or a capacitor, etc. The first chip 101 and the second chip 201 may be grown on the substrate through a semiconductor process. The first chip and the second chip with different functions may be formed using different semiconductor processes. The chip directly grown on the substrate may be more reliable and save more processes compared to the chip formed by other processes, e.g., an adhesion process.

For simplicity, the first chip 101 and the second chip 201 may be shown in a form of a box. The structure of the first chip may include a plurality of constituent components and rewiring (i.e., a metal interconnection structure) that connects the first chip to other circuits, etc. The metal interconnection structure may include a plurality of layers of metal layers and a contact hole that electrically connects adjacent metal layers. A plurality of layers of dielectric layers may be formed on the substrate during the growth of the first chip. The adjacent first chips 101 and the adjacent second chips 201 may be separated by the dielectric layer formed on the substrate to form a structure where each first chip 101 and each second chip 201 are embedded in the surface of the substrate as illustrated in FIG. 1E.

In one embodiment, the dielectric layer may be made of any suitable dielectric material(s), including but not limited to $SiO_2$, fluorocarbon (CF), carbon-doped silicon oxide (SiOC), or silicon carbonitride (SiCN), etc.

The plurality of first chips 101 may have the same or different functions and may have the same or different sizes. The plurality of second chips 201 may have the same or different functions and may have the same or different sizes. The actual quantities, functions and sizes of the first chips 101 and the second chips 201 may be determined according to design requirements and are not limited by the present disclosure. In one embodiment, the second chip 201 may be a chip having the function and type different from the first chip 101. In another embodiment, the second chip 201 may be a same chip as the first chip 101.

The conductive bump 104 may be a tin ball, a copper pillar, a gold bump, or an alloy bump, etc. In another embodiment, the conductive bump 104 may be any other suitable conductive bump structure. The conductive bump 104 may be mainly made of a metal material including but not limited to at least one of tin, copper, nickel, silver tin copper alloy, and tin-based alloy.

The first bonding pad 105 and the second bonding pad 103 each may be made of any suitable metal material including but not limited to at least one of Ag, Au, Cu, Pd, Cr, Mo, Ti, Ta, Sn, W, and Al.

The plug 102 may be any suitable metal plug, or silicon plug (i.e., through silicon via, TSV). The metal plug may be made of a material including but not limited to at least one of Ag, Au, Cu, Pd, Cr, Mo, Ti, Ta, Sn, W, and Al. The silicon plug may be made of a material including doped polysilicon, or undoped polysilicon, etc.

In one embodiment, the encapsulation layer 202 may be made of any suitable encapsulation material. For example, the encapsulation layer 202 may be a mold layer comprising a thermosetting resin. The thermosetting resin may be softened or flowable during the molding process, may be plastic to be made into a certain shape, and at the same time, may undergo chemical reactions to be cured by cross-linking. The mold layer may be made of at least one of phenolic resin, urea-formaldehyde resin, melamine-formaldehyde resin, epoxy resin, unsaturated resin, polyurethane, and polyimide. The epoxy resin may be used to form the mold layer. The epoxy resin may include a filler material or a filler-free material, and may further include various additives (e.g., a curing agent, a modifier, a releasing agent, a thermochromic agent, a flame retardant, etc.). For example, a phenol resin may be used as the curing agent, and solid particles (e.g., silicon fine powders) may be used as the filler material. In another embodiment, the mold layer may be made of silica gel.

The passivation layer 106 may be made of any suitable insulating material. For example, the passivation layer 106 may be made of an inorganic insulating layer, e.g., a silicon oxide layer, a silicon nitride layer, or a silicon oxynitride layer, etc. The passivation layer 106 may be formed by a deposition method, e.g., a chemical vapor deposition, a physical vapor deposition, or an atomic layer deposition, etc. In another embodiment, the passivation layer 106 may be made of an organic insulating layer comprising polyvinylphenol, polyimide, or siloxane, etc. The passivation layer 106 comprising polyvinylphenol, polyimide, or siloxane may be effectively formed by a droplet discharge method, a printing method, or a spin-coating method. According to structures, siloxane may be classified into silica glass, alkylsiloxane polymer, alkylsilsesquioxane polymer, silsesquioxane hydride polymer, alkylsilsesquioxane hydride polymer, etc. In addition, the insulating material may be formed from a material including a polymer (polysilazane) having Si—N bonds. Further, the insulating layers may be laminated to form the passivation layer. In addition to the disclosed components, a full packaging structure in the present disclosure may include other components, which are not described herein.

Accordingly, the wafer-level system-in-package structure in the present disclosure may include the substrate having the plurality of first chips formed therein. The first chip may be formed by being grown on the substrate through a semiconductor process. The wafer-level system-in-package structure may also include an encapsulation layer having the plurality of second chips embedded therein. The encapsulation layer may cover the substrate and the first chip. At least one of the second chips may be electrically connected to at least one of the first chips. The first chip and the second chip that are grown on the substrate through semiconductor processes may be integrated into the wafer-level system-in-package structure, which may significantly reduce the area of the wafer-level system-in-package structure and provide desired electrical performance. An electronic apparatus in the present disclosure may also be featured with the same advantages as the wafer-level system-in-package structure.

Exemplary Embodiment 2

The wafer-level system-in-package structure of the present disclosure may be described in detail with reference to FIG. 4E. FIG. 4E illustrates a cross-sectional view of an exemplary wafer-level system-in-package structure consistent with various disclosed embodiments of the present disclosure.

In one embodiment, referring to FIG. 4E, the substrate 100 may have the front surface and the back surface, and the encapsulation layer 202 may cover the back surface. In other words, the encapsulation layer 202 may cover the surface of the substrate 100 on which the second chip is provided. For example, the encapsulation layer 202 may cover the back surface of the substrate 100, and then the first bonding pad 105 may be disposed on the front surface of the substrate 100.

In one embodiment, the packaging structure may further include the plug 102. The plug 102 may electrically connect the first bonding pad 105 to the first chip 101. For example, referring to FIG. 4E, the plug 102 may penetrate the first chip 101 as well as the front and back surfaces of the substrate, and may be electrically connected to the first bonding pad 105 formed on the front surface of the substrate. The plug may be set according to the actual packaging structure, and is not limited by the present disclosure.

In one embodiment, referring to FIG. 4E, the second bonding pad 103 may be located on the back surface of the substrate 100, and may be electrically connected to the plug 102 and the first chip 101.

The same structure and film layer in the present embodiment and the foregoing Embodiment 1 may be referred to the corresponding description in the Embodiment 1, and are not repeated herein. The wafer-level system-in-package structure in the present embodiment may be featured with the same advantages as the wafer-level system-in-package structure in the Embodiment 1.

Exemplary Embodiment 3

In view of the advantages of the wafer-level system-in-package, the present disclosure provides a wafer-level system-in-package method. Referring to FIG. 5, the method may mainly include the following.

In S1: Providing a substrate having a plurality of first chips. The first chip may be formed by being grown on the substrate through a semiconductor process.

In S2: Providing a plurality of second chips. The second chip may be disposed on the substrate, and at least one of the second chips may be electrically connected to at least one of the first chips through a conductive bump. The first chip and the second chip that are electrically connected to each other may have an overlapping portion.

In S3: Providing an encapsulation material to cover the second chip and the substrate and to fix the second chip.

The wafer-level system-in-package method in the present disclosure may combine a wafer-level package and a system integration method, and at the same time, may realize integration of a plurality of chips and completion of packaging manufacturing on the substrate. The disclosed wafer-level system-in-package method may greatly reduce area of the formed packaging structure, reduce manufacturing cost, optimize electrical performance of the packaging structure, enable batch manufacturing, and significantly reduce the workload and equipment demands. Therefore, the yield of the wafer-level system-in-package method and the performance of the formed packaging structure may be ultimately improved.

The wafer-level system-in-package method in the present disclosure will be described in detail with reference to FIGS. 1A-1E, 2A-2E, 3A-3C, and 4A-4E.

Figure 7:
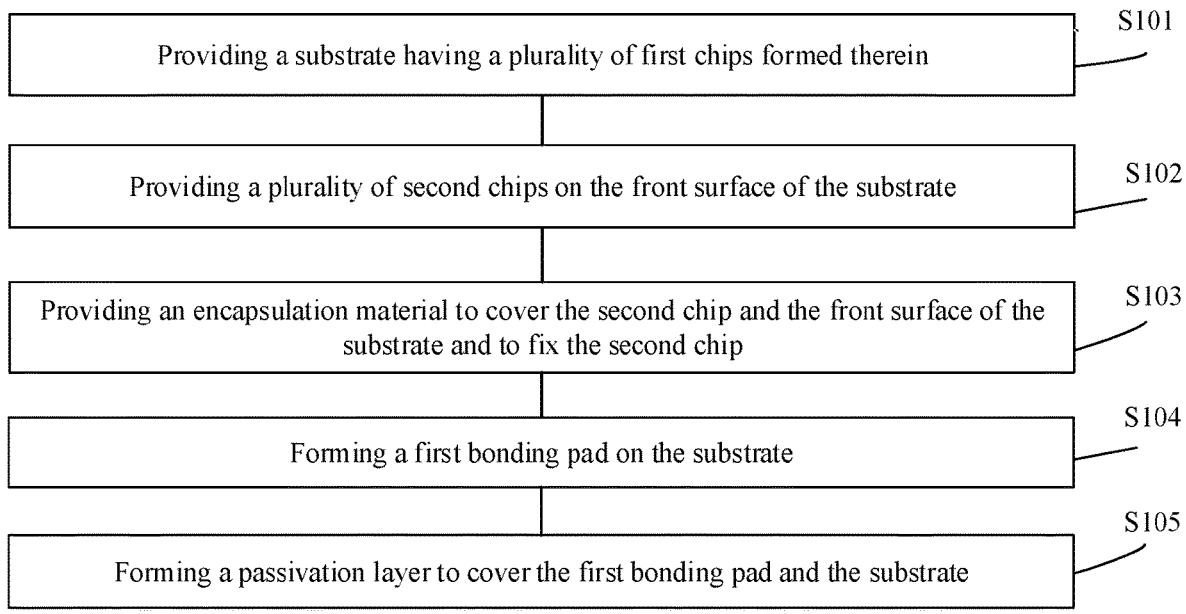
FIG. 7 illustrates a flow chart of another exemplary wafer-level system-in-package method consistent with various disclosed embodiments of the present disclosure.

In one embodiment, the wafer-level system-in-package method may be used to form the wafer-level system-in-package structure illustrated as FIG. 1E in Embodiment 1. FIG. 7 illustrates a flow chart of an exemplary wafer-level system-in-package method consistent with various disclosed embodiments of the present disclosure; and FIGS. 1A-1E illustrate schematic diagrams of semiconductor structures corresponding to certain stages of the exemplary wafer-level system-in-package method.

As shown in FIG. 7, at the beginning of the wafer-level system-in-package method, a substrate having a plurality of first chips may be provided (S101). FIG. 1A illustrates a schematic diagram of a corresponding semiconductor structure.

Referring to FIG. 1A, a substrate 100 having a plurality of first chips 101 formed therein may be provided. The plurality of first chips 101 may have the same or different functions. The plurality of first chips 101 may have the same or different sizes. The actual quantity, functions and sizes of the first chips 101 may be determined according to design requirements, and are not limited by the present disclosure.

In one embodiment, referring to FIG. 1A, before thinning the substrate through the back surface, a plug 102 electrically connected to the first chip 101 may be formed in the substrate 100. An end portion of the plug 102 extending toward the back surface of the substrate 100 may be buried under the back surface. In other words, the end portion of the plug 102 may be buried in the substrate 100.

In one embodiment, the plug 102 may be disposed in an edge region of the first chip 101. In another embodiment, the plug 102 may be disposed in any other suitable region capable of electrically connecting to the first chip 101 without affecting the functional realization of the first chip 101.

The plug 102 may be any suitable metal plug or silicon plug (i.e., through silicon via, TSV). The metal plug may be made of a material including but not limited to at least one of Ag, Au, Cu, Pd, Cr, Mo, Ti, Ta, Sn, W, and Al. The silicon plug may be made of a material including doped polysilicon, or undoped polysilicon, etc.

The plug 102 may be formed using any suitable method. In one embodiment, a patterned mask layer (not illustrated) may be first formed on the front surface of the substrate. The mask layer may be made of any suitable mask material including but not limited to a hard mask material, and a photoresist mask material. In one embodiment, the mask layer may be made of a photoresist mask material. The photoresist mask material may be first spin-coated on the substrate, and then may be patterned by a photolithography process to form the patterned photoresist mask material and to define a position and a critical dimension of the plug to be formed in the patterned photoresist mask material. A portion of the first chip 101 and a portion of the substrate 100 may be etched using the patterned mask layer as a mask to form a through-hole. The etching process may be a wet etching process or a dry etching process. In one embodiment, the dry etching process may be used to form the through-hole. The dry etching process may include but not be limited to a reactive ion etching (ME), an ion beam etching, a plasma etching, or a laser cutting. Subsequently, the patterned mask layer may be removed. In one embodiment, the photoresist mask material may be removed using an ashing method. Further, a metal material or a polysilicon material may be deposited to fill the through-hole to form the metal plug or the silicon plug.

In one embodiment, a second bonding pad 103 may be formed on the front surface of the substrate. The second bonding pad 103 may be electrically connected to the first chip 101. The second bonding pad 103 may be disposed on the surface of the first chip 101. Further, a portion of the second bonding pad 103 may be disposed on the surface of the plug 102 to be electrically connected to the plug 102. Adjacent second bonding pads 103 may be spaced apart by a gap.

The second bonding pad 103 may be formed using any suitable method. For example, a bonding pad material layer may be formed by a deposition method including but not limited to a physical vapor deposition method, and a chemical vapor deposition method, to cover the front surface of the substrate. A portion of the bonding pad material layer may be removed through an etching method to form the plurality of spaced second bonding pads 103.

Returning to FIG. 7, after providing the substrate, a plurality of second chips may be provided (S102). FIG. 1A illustrates a schematic diagram of a corresponding semiconductor structure.

A plurality of second chips may be provided. The second chip may be disposed on the substrate, and at least one of the second chips may be electrically connected to at least one of the first chips through a conductive bump. For example, referring to FIG. 1A, at least one of the second chips 201 may be electrically connected to at least one of the first chips 101 through a conductive bump 104. In one embodiment, the second chip 201 may be a chip having the function and type different from the first chip 101. In another embodiment, the second chip 201 may be a same chip as the first chip 101.

In one embodiment, referring to FIG. 1A, the electrically-connected first chip 101 and second chip 201 may have an overlapping portion. In other words, the projections of the electrically-connected first chip 101 and second chip 201 onto the substrate may have an overlapping portion. In one embodiment, the first chip 101 and the second chip 201 may be partially overlapped. In another embodiment, when the first chip 101 and the second chip 201 are identical in size, the first chip 101 and the second chip 201 may be fully overlapped. The overlap herein may refer to that the first chip 101 and the second chip 201 are overlapped in a top view.

In one embodiment, referring to FIG. 1A, disposing the second chip 201 on the substrate 100 to enable at least one of the second chips 201 to be electrically connected to at least one of the first chips 101 may include the following.

In A1: Forming at least one conductive bump 104 on the surface of the first chip 101. For example, at least one conductive bump 104 may be formed on the surface of each first chip. In one embodiment, the conductive bump 104 may be further formed on the second bonding pad 103. The conductive bumps 104 may be arranged in an array on the surface of the first chip 101.

The conductive bump 104 may be formed by any suitable method. In one embodiment, when the conductive bump 104 is a solder ball (e.g., a tin ball), the solder ball may be placed on the surface (i.e., a position where the bump to be formed is) of at least one of the first chips through a ball-placement process. Further, the solder ball may be placed on a corresponding second bonding pad 103. The ball placement process may refer to placing the selected solder ball matching the bonding pad on the corresponding bonding pad, and such process is called ball placement. The ball placement process may be an artificial ball placement or a ball mounter ball placement.

In one embodiment, the ball placement process may include placing a ball placement mesh on the surface of the first chip 101, placing the solder ball on the ball placement mesh, making the solder ball flat, and adhering the solder ball to the surface of the first chip through the through-holes on the ball placement mesh.

Then, the solder ball may be melted to be electrically connected to the first chip through a reflow soldering process. When the second bonding pad 103 is provided, the solder ball may be electrically connected to the second bonding pad 103. In one embodiment, a temperature of the reflow soldering process may be in a range of approximately 200° C.-260° C. In another embodiment, the temperature of the reflow soldering process may be any other suitable temperature, and is not limited by the present disclosure.

In A2: Referring to FIG. 1A, placing the second chip 201 on the conductive bump 104, where the first chip 101 may be electrically connected to the second chip 201 through the conductive bump 104.

In one embodiment, after placing the second chip 201 on the conductive bump, the conductive bump 104 may be melted by the reflow soldering process to electrically connect the second chip 201 to the conductive bump 104.

In another embodiment, the solder tin paste may be deposited on the first chip (especially on the second bonding pad 103) by a screen printing method. After correspondingly disposing the second chip on the substrate, the reflow soldering process may be performed to electrically connect the first chip to the second chip.

The first chip is electrically connected to the second chip through the conductive bump for illustrative purposes, the first chip may be electrically connected to the second chip through any other suitable jointing method, e.g., a wire bonding, etc., which is not limited by the present disclosure.

In one embodiment, an under-bump metallization (UBM) structure (not illustrated) may be disposed between the second bonding pad 103 and the conductive bump 104. The under-bump metallization (UBM) structure may be formed by stacking multiple metal layers including an adhesive layer, a barrier layer, and a seed or wetting layer. The UBM structure may facilitate to prevent diffusion between the conductive bump and the integrated circuit of the multi-chip semiconductor device, and may provide a low resistance electrical connection.

Returning to FIG. 7, after providing the plurality of second chips, an encapsulation material may be provided (S103). FIGS. 1B-1C illustrate schematic diagrams of corresponding semiconductor structures.

An encapsulation material may be provided to cover the second chip and the substrate and to fix the second chip. In one embodiment, referring to FIG. 1B, the encapsulation material may cover the second chip 201 and the substrate 100 through an injection molding process. The injection molding process may be a hot press injection molding process, or any other suitable injection molding process.

In one embodiment, the injection molding process may use a liquid mold compound, or a solid mold compound. In one embodiment, the liquid mold compound may be used. The liquid mold compound may sufficiently fill the gap between adjacent conductive bumps, i.e., the gap between the first chip and the second chip, before being cured, may increase the adhesion between the first chip and the second chip, and may improve the stability of the packaging structure.

In one embodiment, providing the encapsulation material to cover the second chip and the substrate may include the following. A mold may be provided, and the substrate may be placed in the mold. The mold may be any suitable mold, which is not limited by the present disclosure and may be determined according to actual applications. Then, the mold compound in a molten state may be injected into the mold, and the liquid mold compound may be uniformly coated on the entire substrate to wrap the second chip 201. In addition, a curing process may be performed to solidify the mold compound to form a mold layer as the encapsulation layer 202. The curing process may be a thermal curing process. In certain embodiments, the curing process may be appropriately selected according to the actually used mold compound. Further, a demolding process may be performed.

In one embodiment, a top surface of the encapsulation layer 202 may be above a top surface of the second chip 201. The encapsulation layer 202 may provide physical and electrical protection to the chip against external interference.

In one embodiment, referring to FIG. 1B, the substrate 100 may have a front surface and a back surface. The encapsulation layer 202 may cover the front surface. In view of this, the second chip 201 may be disposed on the front surface of the substrate 100.

In one embodiment, referring to FIG. 1C, the substrate 100 may further include the plug 102 electrically connected to the first chip 101. An end portion of the plug 102 extending toward the back surface of the substrate 100 may be buried under the back surface. After providing the encapsulation material to cover the second chip 201 and the front surface of the substrate 200, the substrate 100 may be further thinned through the back surface until the plug 102 is exposed. The thinning process may include over-etching the plug until the thickness of the substrate reaches a target thickness.

In a packaging method of forming the plug after providing the encapsulation material to cover the second chip and the front surface of the substrate, because the mold layer is often made of an organic material and the substrate is often an inorganic material (e.g., silicon), the thermal expansion coefficients of the corresponding two different materials may be inconsistent. Therefore, the packaging structure may tend to have warpage deformation, thereby affecting the operability of subsequent processes, e.g., back grinding, and yield. Moreover, the grasping of the wafer by a robot to transfer wafer between different processes may become substantially difficult, and the probability of occurrence of fragmentation and unsuccessful grasping may increase. Further, after subsequently forming the plug, the plug may be deviated from the predetermined position and the predetermined electrical connection may not be achieved.

In the present disclosure, the plug may be formed before providing the encapsulation material to cover the second chip and the front surface of the substrate. After providing the encapsulation material to cover the second chip and the front surface of the substrate, the thinning process may be performed. Therefore, various process issues (e.g., electrical connection failure due to deviation of the plug position caused by warpage deformation, and adverse effect of warpage on the thinning process) caused by the formation of the plug for connection after performing the injection molding process may be avoided, and the electrical performance of the packaging structure may be improved.

Figure 3A:
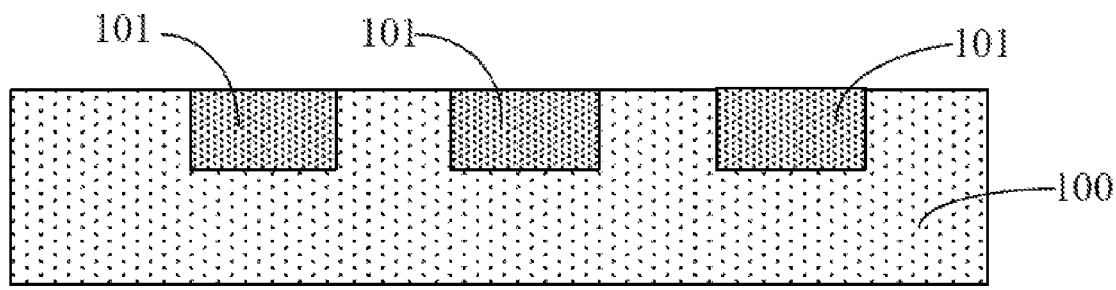
FIGS. 3A-3C illustrate schematic cross-sectional views of semiconductor structures corresponding to certain stages for forming a plug in an exemplary wafer-level system-in-package method consistent with various disclosed embodiments of the present disclosure.
Figure 3B:
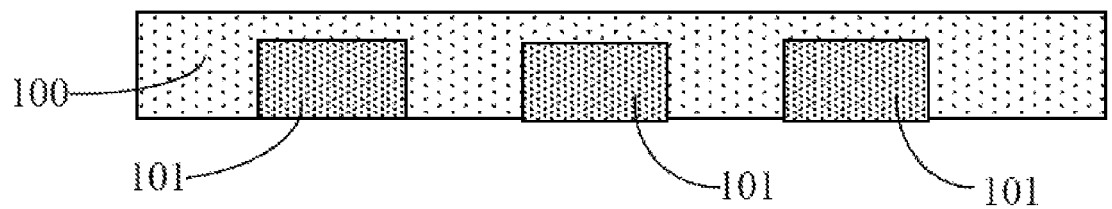
Figure 3C:
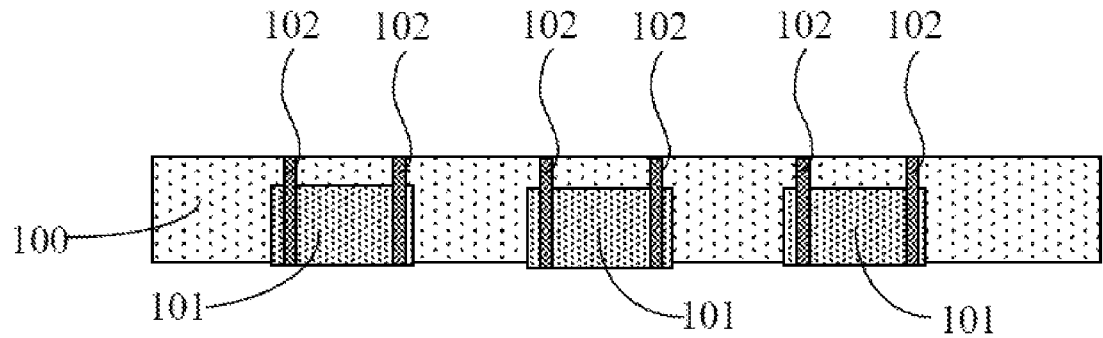

In another embodiment, before providing the encapsulation material to cover the second chip and the front surface of the substrate, the plug may not be formed in the substrate, and the following may be performed. Referring to FIGS. 3A-3C, the substrate 100 may be thinned through the back surface, and the thinning process may stop at a target thickness; and the plug 102 electrically connected to the first chip 101 may be formed in the substrate 100, and the end portion of the plug 102 may be exposed from the back surface of the substrate 100. The thinning process may refer to the aforementioned thinning process associated with FIG. 1C, and is not repeated herein. The plug may be formed by the formation method of the plug in the foregoing embodiment associated with FIG. 1A, and is not repeated herein.

In another embodiment, before performing S102, i.e., before disposing the second chip on the substrate, the following processes C1-C4 may be performed. In C1, referring to FIGS. 2A-2B, the substrate 100 may be first thinned through the back surface until a target thickness is reached. Then, in C2, referring to FIG. 2C, a supporting substrate 21 may be provided. The supporting substrate 21 may be any suitable substrate, e.g., a semiconductor substrate, a glass substrate, a ceramic substrate, etc. The supporting substrate 21 may be jointed to the substrate 100 through the back surface. The joint may use any suitable joint manner, e.g., temporary bonding, or adhesion. For example, the supporting substrate may be jointed to the back surface of the substrate through a bonding adhesive layer. The bonding adhesive layer may be but not limited to an organic polymer material, or an ultraviolet-denatured organic material. Moreover, in C3, referring to FIG. 2D, the second chip 201 may be disposed on the front surface of the substrate 100. The method of disposing the second chip on the front surface of the substrate may refer to the method in the foregoing embodiment associated with FIG. 1A. Further, In C4, referring to FIG. 2E, the supporting substrate may be removed through a suitable removal method selected according to the used joint method. For example, the bonding adhesive layer may be denatured and lose viscosity by a high temperature or an ultraviolet irradiation, and, thus, the supporting substrate may be peeled off. The supporting substrate may be removed after providing the encapsulation material to cover the second chip and the substrate and to fix the second chip.

In another embodiment, before performing the process C1, i.e., before thinning the substrate, the substrate may further have a plug electrically connected to the first chip. An end portion of the plug extending toward the back surface of the substrate may be buried under the back surface. After thinning the substrate, the end portion of the plug may be exposed from the back surface of the substrate.

In another embodiment, before disposing the second chip on the front surface of the substrate, the following may be performed. Referring to FIGS. 3A-3C, the substrate may be thinned through the back surface, and the plug electrically connected to the first chip may be formed in the substrate. An end portion of the plug may be exposed from the back surface of the substrate. The thinning process may be performed using any suitable process, e.g., a mechanical grinding process, a chemical mechanical polishing process, or an etching process, etc. The method of forming the plug may use any suitable method, e.g., the method in the foregoing embodiment associated with FIG. 1A.

A thickness of the thinned substrate may be reasonably set according to actual processes. For example, the thickness of the thinned substrate 100 may be in a range of approximately 10 μm-100 μm. According to the technical nodes, the thickness may vary, and is not limited by the present disclosure.

Returning to FIG. 7, after providing the encapsulation material, a first bonding pad may be formed (S104). FIG. 1D illustrates a schematic diagram of a corresponding semiconductor structure.

Referring to FIG. 1D, a first bonding pad 105 may be formed on the substrate 100. The first bonding pad 105 may be located on the other surface of the substrate 100 with respect to the second chip 201. The first bonding pad 105 may be electrically connected to the plug 102.

In one embodiment, referring to FIG. 1D, before providing the encapsulation material to cover the second chip 201 and the substrate, and after performing the thinning process, when the plug 102 is already formed in the substrate, the first bonding pad 105 may be formed on the substrate. The first bonding pad 105 may be located on the other surface of the substrate with respect to the second chip, and the first bonding pad 105 may be electrically connected to the plug 102. For example, referring to FIG. 1D, when the second chip 201 is disposed on the front surface of the substrate 100, the first bonding pad 105 may be formed on the back surface of the substrate 100.

In another embodiment, referring to FIG. 1D, after providing the encapsulation material to cover the second chip 201 and the substrate 100 and performing the thinning process, and after the plug 102 is already formed in the substrate 100, the first bonding pad 105 may be formed on the substrate 100. The first bonding pad 105 may be located on the other surface of the substrate 100 with respect to the second chip 201, and the first bonding pad 105 may be electrically connected to the plug 102.

The first bonding pad 105 may be formed using any suitable method. For example, a bonding pad material layer may be formed to cover the substrate 100. The bonding pad material layer may be formed using a physical vapor deposition method (PVD), a chemical vapor deposition method (CVD), a sputtering method, an electrolytic plating method, an electroless plating process, or any other suitable metal deposition process. Then, a portion of the bonding pad material layer may be removed by etching to form a plurality of spaced first bonding pads 105.

In one embodiment, each first bonding pad 105 may be electrically connected to one plug 102, respectively. The first bonding pad may be used to lead the device structure composed of the first chip 101 and the second chip 201 to be connected to an external circuit.

Returning to FIG. 7, after forming the first bonding pad, a passivation layer may be formed (S105). FIG. 1E illustrates a schematic diagram of a corresponding semiconductor structure.

Referring to FIG. 1E, a passivation layer 106 may be formed to cover the first bonding pad 105 and the substrate 100. In one embodiment, a top surface of the passivation layer 106 may be above a top surface of the first bonding pad 105. The passivation layer may have an any suitable thickness, which is not limited by the present disclosure and may be determined according to actual applications.

In one embodiment, after depositing the passivation layer 106, a chemical mechanical polishing process may be selectively performed on the surface of the passivation layer 106 to obtain a flat surface.

Subsequently, an opening 107 may be formed in the passivation layer 106 above the first bonding pad 105. The opening 107 may expose at least a portion of the surface of the first bonding pad 105.

To electrically connect the first bonding pad to the external circuit, the opening 107 exposing the surface of the first bonding pad may be desired. The opening 107 may be formed using any suitable method. In one embodiment, a patterned mask layer, e.g., a photoresist layer, may be first formed on the surface of the passivation layer 106. The patterned mask layer may define the position, shape, and a critical dimension of the opening. Then, the exposed passivation layer 106 may be etched using the patterned mask layer as a mask until the surface of the first bonding pad 105 is exposed to form the opening 107. Further, the patterned mask layer may be removed. For example, the mask layer made of the photoresist material may be removed by an ashing process, or a wet etching process.

The main processes of the wafer-level system-in-package method in the present disclosure have been described. The complete method may include other processes. For example, after completing the packaging process, the substrate may be cut along the scribe line to divide the plurality of chips integrated on the substrate into separate units. Each unit may include the first chip and the second chip that are jointed to each other, and the unit may form a system or subsystem that provides multiple functions. The function may be dependent on the function of the actual integrated chip.

Accordingly, the wafer-level system-in-package method in the present disclosure may combine a wafer-level package and a system integration method, and at the same time, may realize integration of a plurality of chips and completion of packaging manufacturing on the substrate. The disclosed packaging integration process on the substrate may greatly reduce area of the packaging structure, reduce manufacturing cost, optimize electrical performance, enable batch manufacturing, and significantly reduce the workload and equipment demands. Further, the plug may be formed in advance, and, thus, various process issues (e.g., electrical connection failure due to deviation of the plug position caused by warpage deformation, and adverse effect of warpage on the thinning process) caused by the formation of the plug for connection after performing the injection molding process may be avoided, and the yield and performance of the device may be improved.

Exemplary Embodiment 4

Figure 4A:
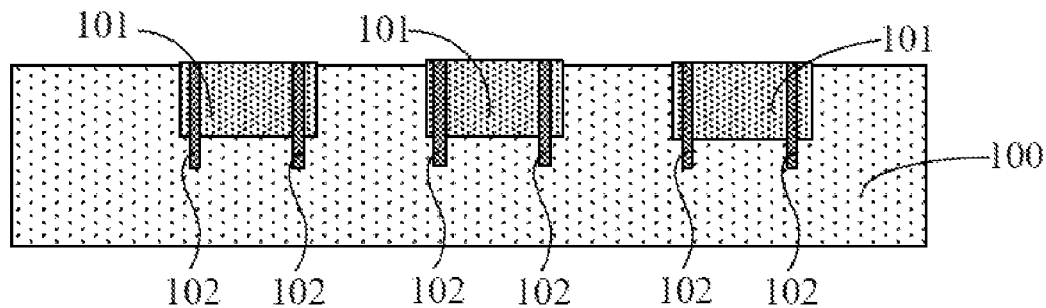
Figure 8:
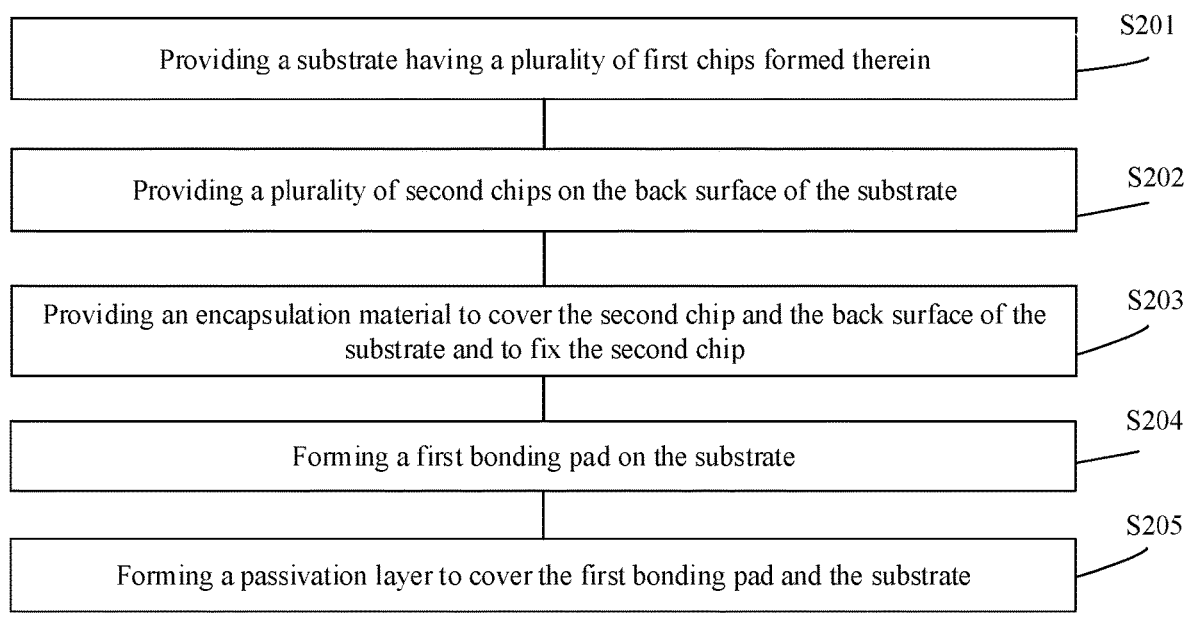
FIG. 8 illustrates a flow chart of another exemplary wafer-level system-in-package method consistent with various disclosed embodiments of the present disclosure.

The present disclosure also provides a method for fabricating the wafer-level system-in-package structure illustrated as FIG. 4E in Embodiment 2. FIG. 8 illustrates a flow chart of another exemplary wafer-level system-in-package method consistent with various disclosed embodiments of the present disclosure; and the wafer-level system-in-package method in the present disclosure will be described in detail with reference to FIGS. 4A-4E. FIGS. 4A-4E illustrate schematic diagrams of semiconductor structures corresponding to certain stages of the exemplary wafer-level system-in-package method.

As shown in FIG. 8, at the beginning of the wafer-level system-in-package method, a substrate having a plurality of first chips may be provided (S201). FIG. 4A illustrates a schematic diagram of a corresponding semiconductor structure.

Referring to FIG. 4A, a substrate 100 having a plurality of first chips 101 may be provided. The process S201 may refer to the description associated with process S101 in the foregoing Embodiment 3, and the descriptions thereof are not repeated herein.

Figure 4B:
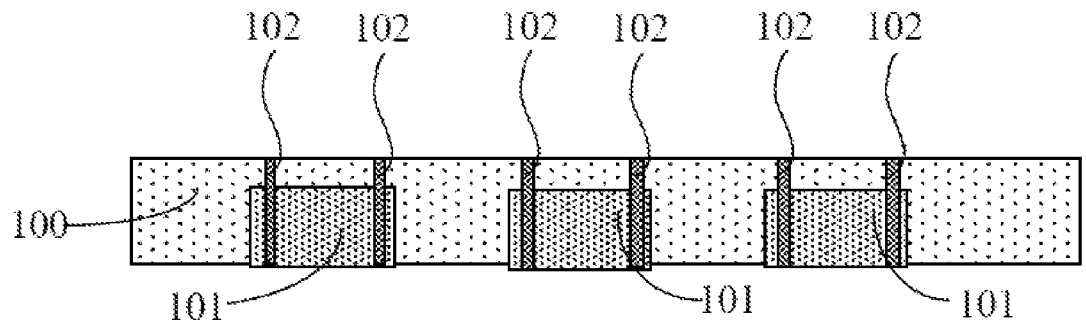
Figure 4C:
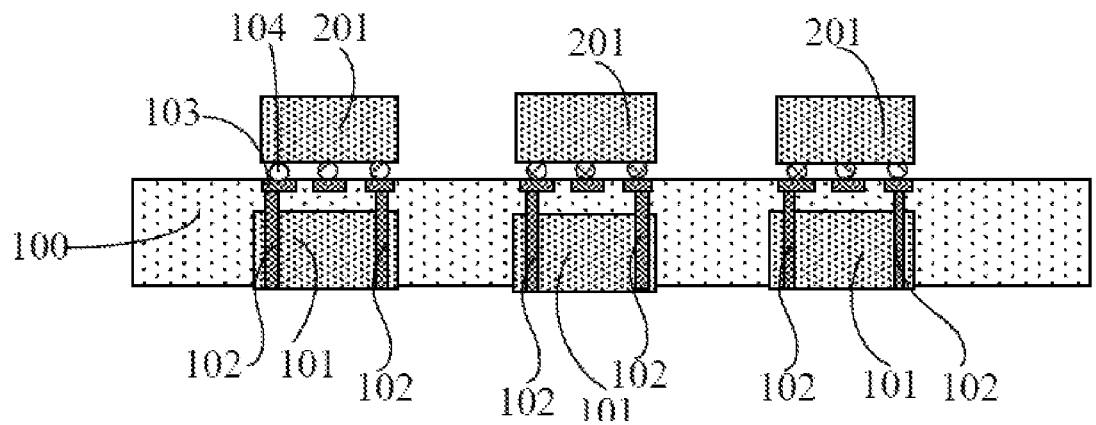

Returning to FIG. 8, after providing the substrate, a plurality of second chips may be provided (S202). FIGS. 4B-4C illustrate schematic diagrams of corresponding semiconductor structures.

A plurality of second chips may be provided. The second chip may be disposed on the substrate, and at least one of the second chips may be electrically connected to at least one of the first chips through a conductive bump.

The second chip 201 may be disposed on the back surface of the substrate 100. In view of this, a plug may be first formed in the substrate 100 before providing the second chip. The plug 102 may be formed in the substrate 100 using the method in the foregoing Embodiment 3. For example, referring to FIG. 4A, the substrate 100 may further include the plug 102 electrically connected to the first chip 101. An end portion of the plug 102 extending toward the back surface of the substrate 100 may be buried under the back surface. Before disposing the second chip on the back surface of the substrate, referring to FIG. 4B, the substrate 100 may be thinned through the back surface until the plug 102 is exposed.

Subsequently, referring to FIG. 4C, the plurality of second chips 201 may be provided. The second chip 201 may be disposed on the substrate 100, and at least one of the second chips 201 may be electrically connected to at least one of the first chips 101 through the conductive bump 104. The electrically-connected first chip 101 and second chip 201 may have an overlapping portion.

Returning to FIG. 8, after providing the plurality of second chips, an encapsulation material may be provided (S203). FIG. 4D illustrates a schematic diagram of a corresponding semiconductor structure.

An encapsulation material may be provided to cover the second chip and the substrate and to fix the second chip. In one embodiment, referring to FIG. 4D, the substrate 100 may have a front surface and a back surface. The encapsulation layer 202 may cover the back surface. In view of this, the second chip 201 may be disposed on the back surface of the substrate 100. The method of forming the encapsulation layer may refer to the corresponding descriptions in the foregoing Embodiment 3, and is not repeated herein.

Returning to FIG. 8, after forming the encapsulation layer, a first bonding pad may be formed (S204). FIG. 4E illustrates a schematic diagram of a corresponding semiconductor structure.

Referring to FIG. 4E, a first bonding pad 105 may be formed on the substrate 100. The first bonding pad 105 may be located on the other surface of the substrate 100 with respect to the second chip 201. The first bonding pad 105 may be electrically connected to the plug 102. Referring to FIG. 4E, when the second chip 201 is disposed on the back surface of the substrate 100, the first bonding pad 105 may be formed on the front surface of the substrate 100.

Returning to FIG. 8, after forming the first bonding pad, a passivation layer may be formed (S205). FIG. 4E illustrates a schematic diagram of a corresponding semiconductor structure.

Referring to FIG. 4E, a passivation layer 106 may be formed to cover the first bonding pad 105 and the substrate 100. An opening 107 may be subsequently formed in the passivation layer 106 above the first bonding pad 105. The opening 107 may expose at least a portion of the surface of the first bonding pad 105.

The same or similar features in the present embodiment and the Embodiment 3 are not repeated herein to avoid duplication, but the corresponding processes in the foregoing Embodiment 3 may be applicable to the present embodiment.

Exemplary Embodiment 5

The present disclosure also provides an electronic apparatus. The electronic apparatus may include a functional electronic device formed by cutting the disclosed wafer-level system-in-package structure. In one embodiment, the electronic apparatus may be any electronic products or equipment, e.g., mobile phone, tablet computer, laptop computer, netbook, game machine, television, VCD, DVD, navigator, digital photo frame, camera, video camera, voice recorder, MP3, MP4, or PSP, etc. In another embodiment, the electronic apparatus may be any intermediate product including circuits. The electronic apparatus in the present disclosure may have desired performance by using the disclosed wafer-level system-in-package structure.

Figure 6:
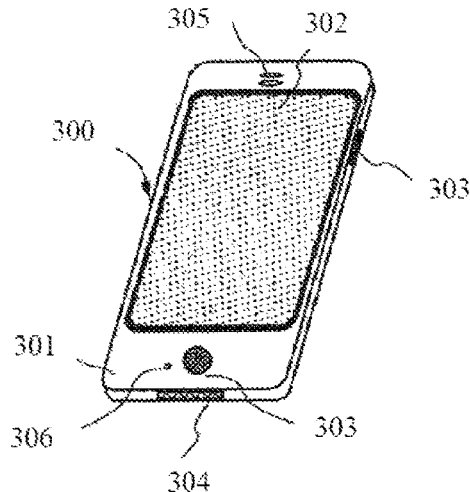
FIG. 6 illustrates a schematic diagram of an exemplary electronic apparatus consistent with various disclosed embodiments of the present disclosure.

FIG. 6 illustrates a mobile phone handset as an example. The mobile phone handset 300 may be provided with a display portion 302 included in a case 301, an operation button 303, an external connection port 304, a speaker 305, and a microphone 306, etc.

In one embodiment, the electronic apparatus may include a substrate having at least one first chip formed therein. The first chip may be formed by being grown on the substrate through a semiconductor process. The electronic apparatus may also include an encapsulation layer having at least one second chip embedded therein. The encapsulation layer may cover the substrate and the first chip. The at least one second chip may be electrically connected to the at least one first chip through a conductive bump, and the first chip and the second chip that are electrically connected to each other may have an overlapping portion. For example, the substrate may have a front surface and a back surface. The encapsulation layer may cover one of the front surface and the back surface. In another embodiment, the electronic apparatus may further include a first bonding pad located on the other surface of the substrate with respect to the encapsulation layer, and a plug electrically connecting the first bonding pad to the first chip. In one embodiment, the encapsulation layer may be a mold layer. For example, the mold layer may be made of an epoxy resin. In certain embodiments, the electronic apparatus may further include a passivation layer having an opening and covering the first bonding pad and the substrate, and a second bonding pad located on the front surface of the substrate and electrically connected to the first chip. The opening may expose the first bonding pad.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A wafer-level system-in-package (SiP) structure, comprising:
    a substrate having a front surface and an opposite back surface and having a plurality of first chips formed therein;

an encapsulation layer having a plurality of second chips embedded therein, wherein the encapsulation layer covers the front surface of the substrate and the first chips;
a first bonding pad, located on the back surface of the substrate away from the encapsulation layer; and
a plug, electrically connecting the first bonding pad to the first chip,
wherein:
at least one of the plurality of second chips is electrically connected to at least one of the plurality of first chips through a conductive bump, and electrically-connected first and second chips have an overlapping portion.

2. The structure according to claim 1, wherein:
the conductive bump is made of one of tin and copper.

3. The structure according to claim 1, wherein:
the encapsulation layer is a mold layer.

4. The structure according to claim 3, wherein:
the mold layer is made of epoxy resin.

5. The structure according to claim 3, further including:
a passivation layer having an opening, wherein the passivation layer covers the first bonding pad and the substrate, and the opening exposes the first bonding pad.

6. The structure according to claim 1, further including:
a second bonding pad, located on the front surface of the substrate and electrically connected to the first chip.

7. The structure according to claim 3, wherein:
the plug is one of a metal plug and a silicon plug.

8. The structure according to claim 3, wherein:
the first bonding pad is made of one of Ag, Au, Cu, Pd, Cr, Mo, Ti, Ta, Sn, W, and Al.

9. An electronic apparatus, comprising:
a wafer-level system-in-package structure, wherein the wafer-level system-in-package structure includes:
a substrate having a front surface and an opposite back surface and having a plurality of first chips formed therein;
an encapsulation layer having a plurality of second chips embedded therein, wherein the encapsulation layer covers the front surface of the substrate and the first chips;
a first bonding pad, located on the back surface of the substrate away from the encapsulation layer; and
a plug, electrically connecting the first bonding pad to the first chip,
wherein:
at least one of the plurality of second chips is electrically connected to at least one of the plurality of first chips through a conductive bump, and electrically-connected first and second chips have an overlapping portion.

10. The electronic apparatus according to claim 9, wherein:
the conductive bump is made of one of tin and copper.

11. The electronic apparatus according to claim 9, wherein:
the encapsulation layer is a mold layer.

12. The electronic apparatus according to claim 11, wherein:
the mold layer is made of epoxy resin.

13. The electronic apparatus according to claim 9, further including:
a passivation layer having an opening, wherein the passivation layer covers the first bonding pad and the substrate, and the opening exposes the first bonding pad.

14. The electronic apparatus according to claim 9, further including:
a second bonding pad, located on the front surface of the substrate and electrically connected to the first chip.

15. The electronic apparatus according to claim 9, wherein:
the plug is one of a metal plug and a silicon plug.

16. The electronic apparatus according to claim 9, wherein:
the first bonding pad is made of one of Ag, Au, Cu, Pd, Cr, Mo, Ti, Ta, Sn, W, and Al.

17. The electronic apparatus according to claim 5, wherein:
a top surface of the passivation layer is above a top surface of the first bonding pad.

18. The electronic apparatus according to claim 1, wherein:
a plurality of dielectric layers are formed on the substrate to separate adjacent first chips and second chips.

19. The electronic apparatus according to claim 1, wherein:
the at least one of the plurality of second chips is electrically connected to the at least one of the plurality of first chips through a plurality of conductive bumps arranged in an array.

20. The electronic apparatus according to claim 6, further comprising:
an under-bump metallization structure disposed between the second bonding pad and the conductive bump.

* * * * *